United States Patent [19]
Song

[11] Patent Number: 5,910,682
[45] Date of Patent: Jun. 8, 1999

[54] SEMICONDUCTOR CHIP STACK PACKAGE

[75] Inventor: Chi-Jung Song, Daejon, Rep. of Korea

[73] Assignee: LG Semicon Co., Ltd., Cheongju, Rep. of Korea

[21] Appl. No.: 08/876,436

[22] Filed: Jun. 16, 1997

[30] Foreign Application Priority Data

Jun. 17, 1996 [KR] Rep. of Korea ................ 96/21865

[51] Int. Cl.⁶ .................................................. H01L 23/02
[52] U.S. Cl. ............................ 257/685; 257/686; 257/723
[58] Field of Search ..................................... 257/723, 686, 257/678, 713, 685

[56] References Cited

U.S. PATENT DOCUMENTS 5,619,067  4/1997  Sua et al. .................................. 257/723
5,714,802  2/1998  Cloud et al. .............................. 257/723

*Primary Examiner*—Peter Toby Brown
*Assistant Examiner*—Roy Potter
*Attorney, Agent, or Firm*—Fleshner & Kim

[57] ABSTRACT

A semiconductor chip stack package includes a plurality of semiconductor chips, each having a plurality of chip pads formed on an upper surface and a plurality of wires respectively coupling a corresponding one of the plurality of chip pads to an edge portion of the semiconductor chip. A package body is formed by stacking the plurality of semiconductor chips one over another using a first adhesive medium. A tab tape attaches to a second side surface of the package body using a third adhesive medium. A heat sink attaches to each of a lower, upper and first side surfaces of the package body using a second adhesive medium. Then, a plurality of solder balls is formed on a lower surface of the tab tape for coupling to an external medium, such as a printed circuit board. The stack package facilitates external emission of the heat generated by the semiconductor chips to prevent the stack package reliability from deterioration.

19 Claims, 4 Drawing Sheets

SEMICONDUCTOR CHIP STACK PACKAGE

BACKGROUND OF THE INVENTION

1. Field of the Invention

The present invention relates to a semiconductor chip package, and in particular, to a semiconductor chip stack package and fabrication method having a plurality of heat sinks.

2. Background of the Related Art

FIGS. 1A and 1B show related art semiconductor chip stack packages. FIG. 1A shows a two-chip stacked semiconductor package, and FIG. 1B shows a three-chip stacked semiconductor package. A plurality of semiconductor chips 2 are stacked on a semiconductor substrate interposing an insulating adhesive 3. Chip pads (not shown) on the semiconductor chips 2 are respectively connected via a corresponding one of a plurality of conductive wires 4 to the semiconductor substrate 1.

The related art chip package structures make a stack package structure by stacking a plurality of semiconductor chips one atop another. However, the related art stack package becomes undesirably large in size because of the wire loops. Thus, a minimal size package is difficult to obtain using the related art structures.

FIG. 2 shows a cross-sectional view of another related art semiconductor chip stack package that includes a plurality of bumps 11 formed on each side portion of the surfaces of respective semiconductor chips 10, 10'. The bumps 11 can be respectively coupled to a corresponding one of a plurality of inner leads 12. The plurality of inner leads 12 extend to an outer lead 13. A predetermined area of the package including the semiconductor chips 10, 10' and the inner leads 12 is molded by an epoxy molding compound 14.

The stack package shown in FIG. 2, however, has a disadvantage because the semiconductor package chips 10, 10' emit significant heat during operation, but discharge the heat through the outer leads 13. The heat discharge by the chips 10, 10' is not sufficient, which deteriorates package reliability.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

Accordingly, it is an object of the present invention to provide a semiconductor chip stack package for enhancing package reliability by employing a plurality of heat sinks to facilitate heat emission of semiconductor chips.

To achieve at least the above-described objects, a semiconductor chip stack package includes a plurality of semiconductor chips having a plurality of chip pads formed on an upper surface, a plurality of wires respectively coupled from a corresponding one of the plurality of chip pads to an edge portion of the corresponding semiconductor chip, a package body formed by stacking the plurality of semiconductor chips with a first adhesive medium layered in between the semiconductor chips, a tab tape attached by a third adhesive medium to a second surface of the package body, a heat sink attached on each of a lower, upper and first side surfaces of the package body using a second adhesive medium and a plurality of solder balls formed on a lower surface of the tab tape.

Further, to achieve at least the above-described objects, a semiconductor chip stack package fabrication method includes forming a plurality of chip pads on respective semiconductor chips, coupling the respective chip pads with wires to edge portions of the semiconductor chips, forming a package body by stacking the respective semiconductor chips, attaching a tab tape on a side surface of the package body, attaching a heat sink on an upper, lower and first side surface of the package body, and forming a plurality of solder balls on a lower surface of the tab tape.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

A first preferred embodiment of the semiconductor chip stack package according to the present invention will now be described.

Figure 1A:
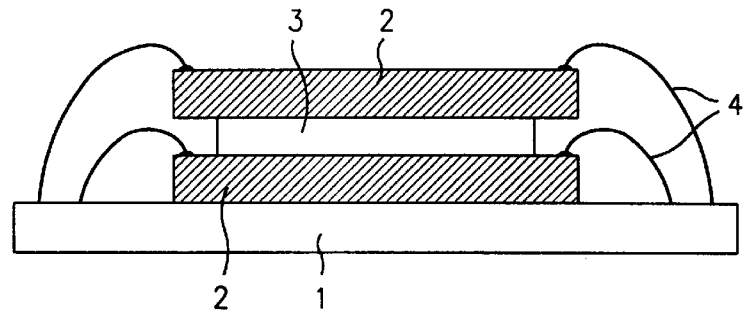
FIGS. 1A and 1B are diagrams showing cross-sectional views of related art semiconductor chip stack packages.
Figure 1B:
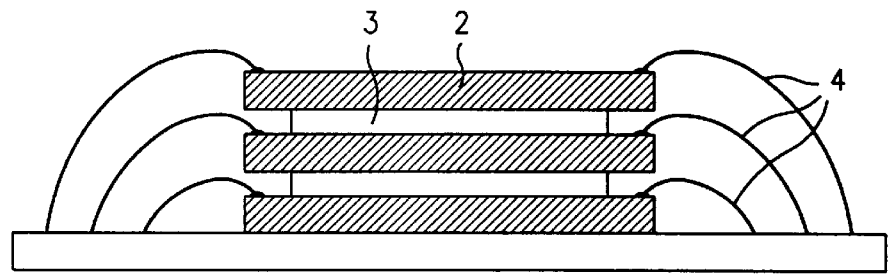
Figure 2:
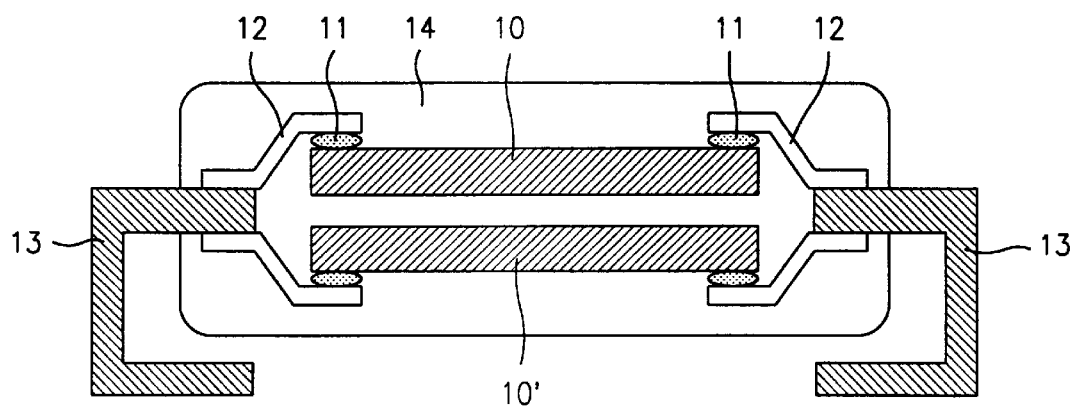
FIG. 2 is a diagram showing a cross-sectional view of another related art semiconductor chip stack package.
Figure 3:
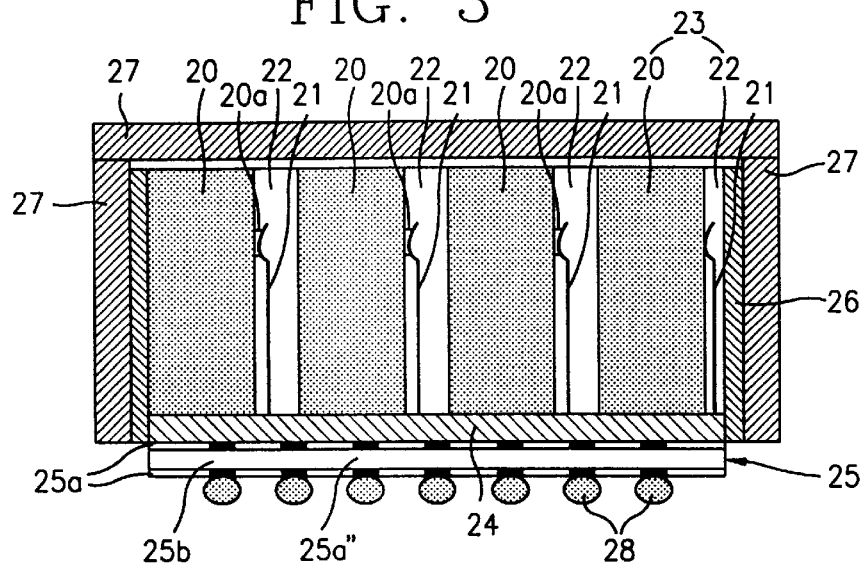
FIG. 3 is a diagram showing a cross-sectional view of a preferred embodiment of a semiconductor chip stack package according to the present invention.

As shown in FIG. 3, a semiconductor stack package includes a plurality of chip pads 20a formed on an upper surface of a plurality of semiconductor chips 20 and a plurality of wires 21 coupling respectively one of the plurality of chip pads 20a to an edge portion of the corresponding semiconductor chip 20. A package body 23 is formed by stacking the plurality of semiconductor chips 20 one on another interposing a first adhesive medium 22. A tab tape 25 is attached along another side surface of the package body 23 using a second adhesive medium 24, and a heat sink 27 is mounted on each of a lower, upper and side surfaces of the stacked package body 23 using a third adhesive medium 26. Finally, a plurality of solder balls 28 is formed on a lower surface of the tab tape 25.

As shown in FIG. 3, the tab tape 25 includes a metallic layer 25b and a pair of adhesive layers 25a, which have a plurality of through-holes 25a'. The plurality of through holes 25a' are formed through each of the adhesive layers 25a that attach on an upper surface and a lower surface of the metallic layer 25b. Each of the plurality of the through-holes 25a' is filled with a filling agent 25a".

One preferred embodiment of a fabrication method of the present invention will now be described with reference to FIGS. 4B–4E.

Figure 4A:
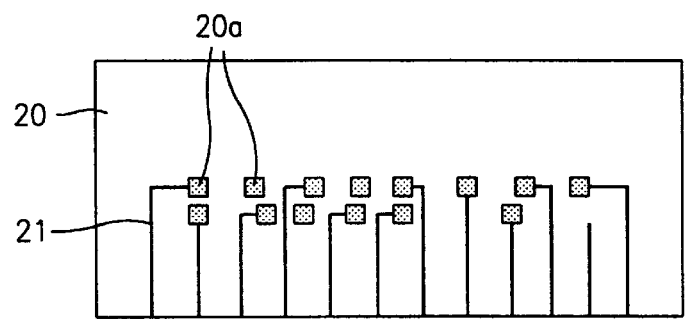
FIG. 4A is a diagram showing a plan view of a semiconductor chip in the semiconductor chip stack package of FIG. 3.

As shown in FIG. 4A, the plurality of chip pads 20a are formed on each of the semiconductor chips 20, and a plurality of wires 21 extend from each of the respective chip pads 20a to couple a corresponding one of the edge portions of the semiconductor chips 20. The wires 21 are formed of conductive material such as metal.

Figure 4B:
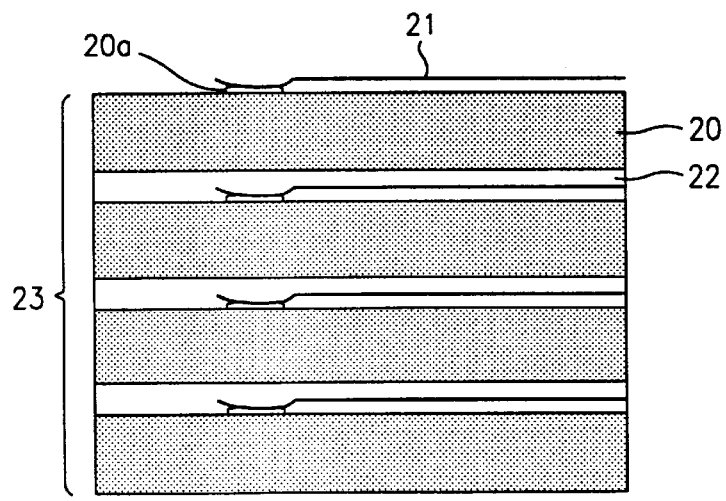
FIGS. 4B–4E are diagrams showing cross-sectional views of a preferred embodiment of a semiconductor chip stack package fabrication method according to the present invention.

As shown in FIG. 4B, the respective semiconductor chips 20 are stacked one after another with the first adhesive medium 22 formed in between. The first adhesive medium is preferably formed of insulation material. The stacked semiconductor chips 21 are formed into the package body 23.

Figure 4C:
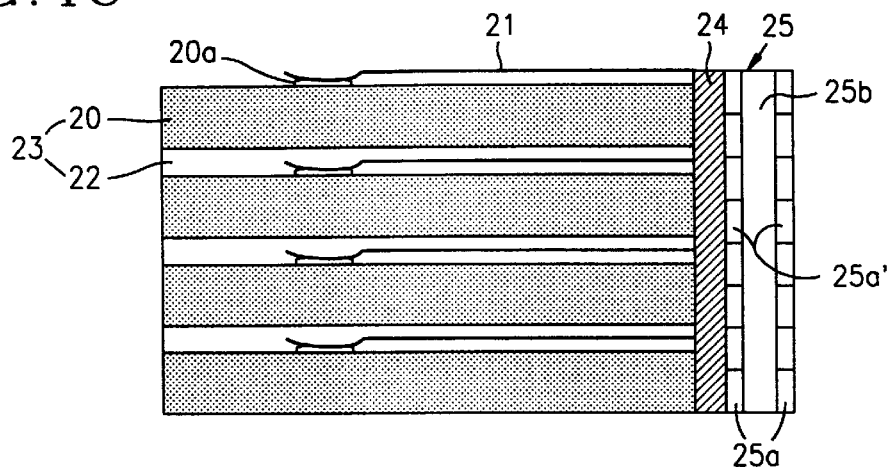

As shown in FIG. 4C, the tab tape attaches on the side surface of the package body 23 using the second adhesive medium 24, which is preferably formed of anisotropically conductive material. At this time, the chip pads 20a and the tab tape 25 are respectively coupled to each other by the wires 21. As discussed above, the tab tape 27 is formed by the metallic layer 25b between the pair of adhesive layers 25a. The plurality of through-holes 25a' are patterned through each of the adhesive layers 25a.

Figure 4D:
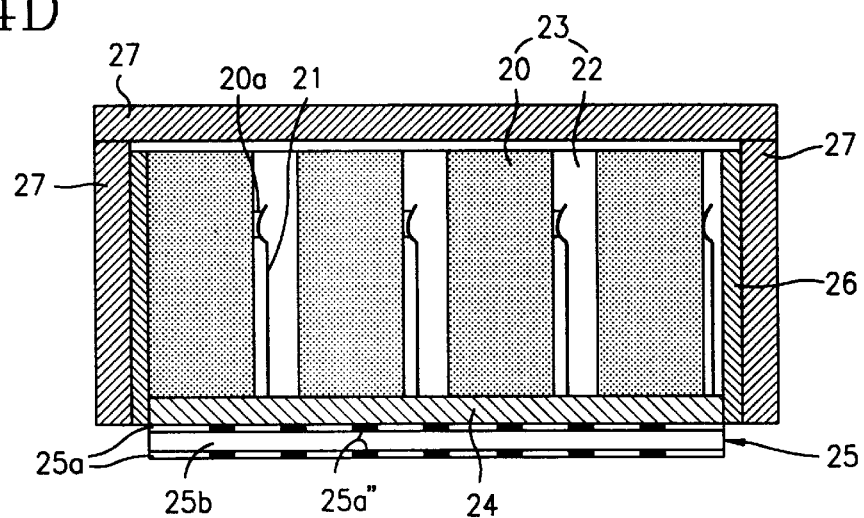

As shown in FIG. 4D, the plurality of through-holes 25a' are then respectively filled with a filling agent 25a". Using the third adhesive medium 26, the thermally conductive heat sink 27 is attached on each of the upper, lower and side surfaces of the package body 23. Preferably, the heat sink 27 is formed from one of copper, an alloy of copper and nickel, or aluminum.

Figure 4E:
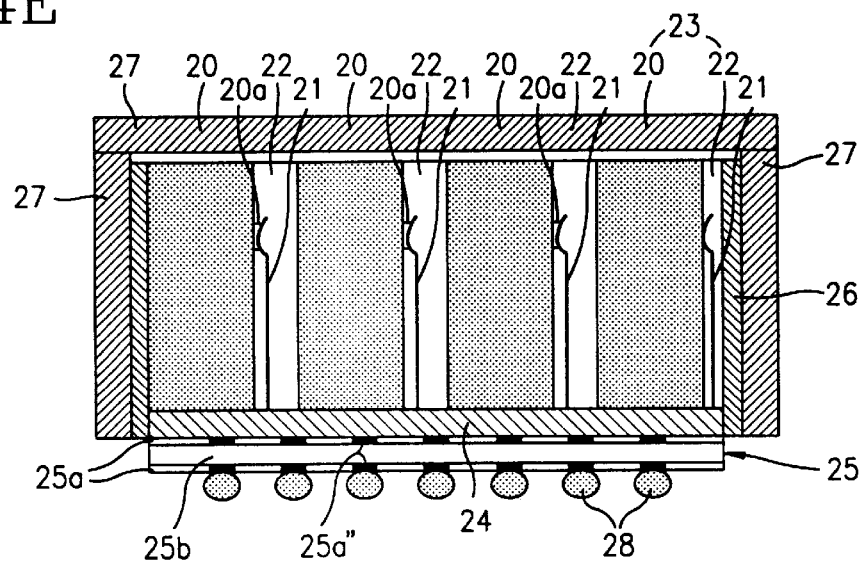

As shown in FIG. 4E, a solder ball 28 is then formed coupled to a lower portion of each of the filling agents 25a" filling the through-holes 25a' to complete one preferred fabrication method of chip stack package.

Figure 5:
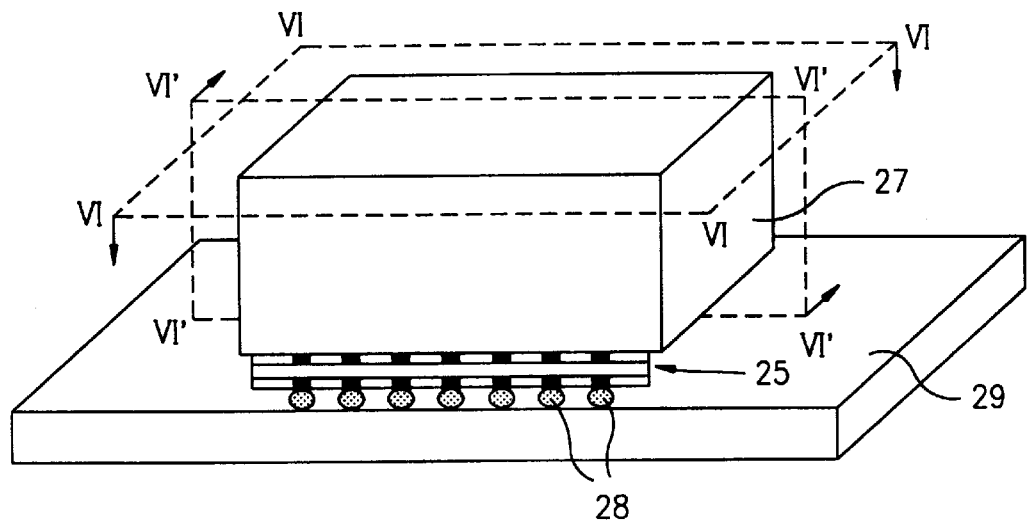
FIG. 5 is a diagram showing a perspective view of the semiconductor chip package of FIG. 3 mounted on a printed circuit board.

As shown in FIG. 5, the chip stack package including the package body 23 and the heat sinks 27 on the upper, lower and side surfaces of the package body 23 can be mounted on a printed circuit board 29 with, for example, the plurality of solder balls 28.

Figure 6:
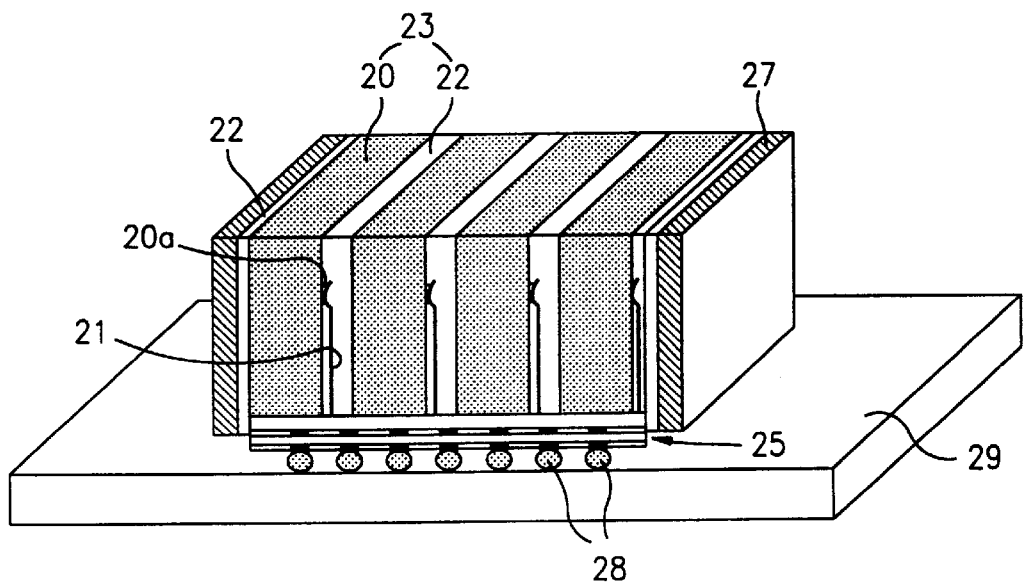
FIG. 6 is a diagram showing a perspective view of the stack package along respective planes VI and VI' of FIG. 5.

FIG. 6 shows a perspective view of the remnant chip stack package after cutting out the semiconductor chip stack package along respective planes VI and VI' of FIG. 5. The semiconductor chip stack package is mounted on the printed circuit board 29 using the solder balls 28 as a medium. The cross-sectional view taken along plane VI' of FIG. 5 is similar to that of FIG. 3.

As shown above, the semiconductor chip stack package according to the present invention couples the wires 21 to the tab tape 25 instead of to a semiconductor substrate as in the related art. Accordingly, the stack package of the preferred embodiments can achieve a smaller chip stack package size.

Further, in the preferred embodiments of the semiconductor chip stack package, the heat sink 27 attached on the upper, lower and side surfaces of the package body 23 facilitates the external emission of the heat generated by the semiconductor chips 20, which prevents the package from deterioration.

It is understood that both the foregoing general description and the following detailed description are exemplary and explanatory. It will be apparent to those skilled in the art that various modifications can be made in the semiconductor chip stack package and fabrication method of the present invention without departing from the spirit or scope of the invention. It is intended that the present invention cover the modifications and variations of this invention that are within the scope of the appended claims and their equivalents.

What is claimed is:

1. A semiconductor chip stack package, comprising:
   a plurality of semiconductor chips having a plurality of chip pads formed on a first surface;
   a plurality of wires on the first surface of each of the plurality of semiconductor chips respectively coupling a corresponding one of the plurality of chip pads to a corresponding edge portion of the semiconductor chip;
   a package body including the plurality of semiconductor chips stacked to interpose a first adhesive medium on said each of the plurality of semiconductor chips;
   a tab tape attached on a first side surface of the package body using a second adhesive medium, wherein the tab tape comprises,
   a pair of adhesive layers each having a plurality of holes, and
   a metallic layer formed between the pair of adhesive layers;
   a filling agent to fill the plurality of holes; and
   a conductive ball array coupled to the filling agent in the plurality of holes.

2. The stack package of claim 1, wherein the plurality of wires couples said corresponding ones of the plurality of chip pads to the tab tape and are formed of a conductive material.

3. The stack package of claim 1, wherein the first adhesive medium is a insulation material.

4. The stack package of claim 1, wherein the second adhesive medium is an anisotropically conductive material.

5. The stack package of claim 1, further comprising a plurality of heat sinks attached on other surfaces of the package body, wherein the heat sinks are attached by a thermally conductive adhesive.

6. The stack package of claim 1, wherein the filling agent is a conductive material.

7. The stack package of claim 5, wherein the third adhesive medium is a thermally conductive material.

8. The stack package of claim 5, wherein the heat sink is one of at least copper, an alloy of copper and nickel, and aluminum.

9. The stack package of claim 1, wherein the conductive ball array is formed on a surface of the tab tape, and wherein the conductive balls are formed on the surface opposite from the second adhesive medium.

10. The stack package of claim 1, wherein the tab tape does not extend beyond dimensions of the first side surface of the package body.

11. The stack package of claim 1, wherein the plurality of semiconductor chips are electrically connected outside the stack package using the chip pads, the plurality of wires, the tab tape, the filling agent and the conductive ball array.

12. A semiconductor chip stack package, comprising:
   a plurality of semiconductor chips having a plurality of chip pads formed on a top surface;
   a plurality of wires on the top surface of each of the plurality of semiconductor chips respectively coupling a corresponding one of the plurality of chip pads to a corresponding edge portion of the semiconductor chip;
   a package body including the plurality of semiconductor chips stacked to interpose a first adhesive medium between the top surface of said each of the plurality of semiconductor chips and a bottom surface of an adjacent one of the plurality of semiconductor chips;

a tab tape attached on a first surface of the package body using a second adhesive medium, wherein the tab tape comprises a plurality of through-holes, and wherein the tab tape does not extend beyond the dimensions of the first surface of the package body;

a filling agent filled in the through-holes and electrically connected to the wires; and a conductive ball array connected to the filling agent on an outside surface of the tab tape.

13. The stack package of claim 12, wherein the plurality of through-holes are within the dimensions of the plurality of semiconductor chips on the first surface of the package body.

14. The stack package of claim 12, further comprising a plurality of heat sinks attached on other surfaces of the package body, and wherein the heat sinks are attached by a thermally conductive adhesive.

15. A semiconductor chip stack package, comprising:

a plurality of stacked semiconductor chips, wherein each of the semiconductor chips has a plurality of chip pads on a top surface;

a plurality of wires on the top surface of each of the chips, wherein one end of each of the wires is connected to a corresponding one of the plurality of chip pads and the other end of the each of the wires extends to a first surface of the stacked chips;

a tab tape attached to the first surface of the stacked chips, wherein the tab tape has a plurality of through-holes; and a filling agent filled in the through-holes and electrically connected to the wires.

16. The stack package of claim 15, wherein the chips are vertically stacked over the top surfaces, and wherein the stacked chips interpose an insulating adhesive material.

17. The stack package of claim 15, wherein the tab tape is attached on the first surface of the stacked chips by anisotropic conductive film.

18. The stack package of claim 15, further comprising a plurality of heat sinks attached on other surfaces of the package body, and wherein the heat sinks are attached by a thermally conductive adhesive.

19. The stack package of claim 15, wherein the filling agent is a conductive material, and wherein tab tape comprises:

a pair of adhesive layers each having a plurality of holes; and a metallic layer formed between the pair of adhesive layers.

\* \* \* \* \*